United States Patent
Kim et al.

(10) Patent No.: US 8,093,982 B2
(45) Date of Patent: Jan. 10, 2012

(54) THREE DIMENSIONAL INDUCTOR AND TRANSFORMER DESIGN METHODOLOGY OF GLASS TECHNOLOGY

(75) Inventors: Jonghae Kim, San Diego, CA (US);
Milind P. Shah, San Diego, CA (US);
Chi Shun Lo, San Diego, CA (US);
Je-Hsiung Lan, San Diego, CA (US);
Xia Li, San Diego, CA (US); Matthew Michael Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/731,393

(22) Filed: Mar. 25, 2010

(65) Prior Publication Data

US 2011/0234357 A1      Sep. 29, 2011

(51) Int. Cl.
*H01F 5/00* (2006.01)
(52) U.S. Cl. ........................................... 336/200
(58) Field of Classification Search ............ 336/65, 336/200, 232; 257/531
See application file for complete search history.

(56) References Cited

U.S. PATENT DOCUMENTS

| | | | |
|---|---|---|---|
| 3,399,361 A * | 8/1968 | Belson | 333/161 |
| 3,881,244 A | 5/1975 | Kendall | |
| 4,978,639 A | 12/1990 | Hua et al. | |
| 5,461,353 A | 10/1995 | Eberhardt | |
| 5,576,680 A | 11/1996 | Ling | |
| 5,781,079 A * | 7/1998 | Okada et al. | 333/24.1 |
| 6,028,495 A * | 2/2000 | Umegaki | 333/24.1 |
| 6,803,848 B2 * | 10/2004 | Yeo et al. | 336/200 |
| 7,489,222 B2 * | 2/2009 | Edo et al. | 336/200 |
| 2007/0176845 A1 | 8/2007 | Yamazaki et al. | |
| 2007/0205855 A1 | 9/2007 | Hashimoto | |
| 2008/0001269 A1 | 1/2008 | Hsu et al. | |

FOREIGN PATENT DOCUMENTS

| | | |
|---|---|---|
| EP | 0649152 A2 | 4/1995 |
| EP | 0725407 A1 | 8/1996 |
| WO | WO2007039878 A1 | 4/2007 |

OTHER PUBLICATIONS

International Search Report and Written Opinion—PCT/US2011/029978, ISA/EPO—Jul. 4, 2011.

* cited by examiner

*Primary Examiner* — Tuyen Nguyen
(74) *Attorney, Agent, or Firm* — Michelle Gallardo; Nicholas J. Pauley; Jonathan T. Velasco

(57) ABSTRACT

An inductor or transformer for use in integrated circuit devices that includes a high-resistivity substrate. The inductor includes a plurality of conductive traces around the substrate forming a continuous conductive path from a first to a second port. The conductive path can be solenoid-shaped. Some of the conductive traces can be formed during back-end-of-line processing or backside plating of an integrated circuit die. The transformer includes a first inductor with input and output ports, and a first continuous conductive path therebetween; and a second inductor with input and output ports, and a second continuous conductive path therebetween. The second inductor is independent of and electromagnetically coupled to the first inductor. The first and second conductive paths can be solenoid-shaped. The first conductive path can be interleaved with the second conductive path.

23 Claims, 10 Drawing Sheets

THREE DIMENSIONAL INDUCTOR AND TRANSFORMER DESIGN METHODOLOGY OF GLASS TECHNOLOGY

FIELD OF DISCLOSURE

The present disclosure relates generally to integrated circuit devices, and more particularly, to inductors and transformers implemented in a high resistivity substrate for use in integrated circuit devices.

BACKGROUND

Inductors and transformers are used in a wide variety of integrated circuit applications including radio frequency (RF) integrated circuit applications. An inductor is a passive electrical component that can store energy in a magnetic field created by the current passing through it. An inductor can be a conductor shaped as a coil or solenoid which includes one or more "turns." The turns concentrate the magnetic field flux induced by current flowing through each turn of the conductor in an "inductive" area within the inductor turns. The number of turns and the size of the turns affect the inductance.

Two (or more) inductors which have coupled magnetic flux form a transformer. A transformer is a device that transfers electrical energy from one circuit to another through inductively coupled conductors, usually the coils or turns of the inductors that form the transformer. A varying current in a first or "primary" inductor induces a varying voltage in a second or "secondary" inductor. If a load is coupled to the secondary inductor, a current will flow in the secondary inductor and electrical energy will flow from the primary circuit through the transformer to the load.

Integrated circuits can be designed using different technologies, for example complementary metal oxide semiconductor (CMOS) technology, glass technology, sapphire technology, quartz technology, etc. These different technologies have different properties that make them better suited for different applications. For example, CMOS technology is well suited for active components, such as transistors, which can shrink as feature sizes shrink. However, passive components, such as inductors, do not shrink with feature size and can thus consume a relatively significant amount of space in CMOS technology. As another example, glass technology is not as well suited for active devices but, since it can be less expensive than CMOS technology, glass technology can be better suited for passive devices. There are various other properties that distinguish the various technologies which are known to those of skill in the art.

Conventional inductors implemented in integrated circuit dies and circuit packages can have several drawbacks. These inductors can be made by forming helical or spiral traces in conductive layers to form inductor turns. In some cases, these traces may be coupled to traces in adjacent layers in order to achieve higher inductance. Unfortunately, the inductors can consume excessive metal layer resources and may not provide sufficient current capacity or high enough quality factor without undesirable scaling. In addition, because the inductive areas of the inductors are substantially parallel with respect to other trace layers in the package substrate and circuit die, they can have unfavorable electromagnetic interference (EMI) effects on other components within the integrated circuit and/or their inductor characteristics can be adversely affected by adjacent conductors within the substrate or circuit die.

It would be desirable to have an inductor and transformer implementation that can create higher inductance values and yet take up less space desirable for other components and have less adverse EMI effects with other components.

SUMMARY

An inductor having a first port and a second port for use in an integrated circuit device is disclosed. The inductor includes a high-resistivity substrate having a top-side, a bottom-side, a first sidewall and a second sidewall. The inductor also includes a plurality of substantially parallel top-side conductive traces on the top-side of the substrate, a plurality of substantially parallel bottom-side conductive traces on the bottom-side of the substrate, and a plurality of sidewall conductive traces on the first sidewall and the second sidewall of the substrate. Each of the sidewall conductive traces on the first sidewall and the second sidewall couple one of the top-side conductive traces to one of the bottom-side conductive traces. The top-side conductive traces, bottom-side conductive traces and sidewall conductive traces form a continuous conductive path from the first port to the second port of the inductor. The top-side conductive traces, bottom-side conductive traces and sidewall conductive traces can form a solenoid-shaped conductive path from the first port to the second port of the inductor.

The high-resistivity substrate can be made of glass, sapphire, quartz or other high-resistivity material: The top-side conductive traces can be formed during back-end-of-line processing of an integrated circuit die: The bottom-side conductive traces can be formed by a backside plating process of the integrated circuit die.

The inductor can also include channels on the first sidewall and the second sidewall of the substrate, and the sidewall conductive traces can be formed in the channels. The sidewall conductive traces can be printed on the first sidewall and the second sidewall of the substrate.

The inductor can also include a plurality of top contacts and a plurality of bottom contacts coupled to the first sidewall and the second sidewall of the substrate, where each of the sidewall conductive traces couples to one of the top-side conductive traces through one of the top contacts, and couples to one of the bottom-side conductive traces through one of the bottom contacts. The inductor can also include a top insulating layer on the top-side of the substrate and a bottom insulating layer on the bottom-side of the substrate, where the top insulating layer is located between the top-side of the substrate and the top-side conductive traces and the bottom insulating layer is located between the bottom-side of the substrate and the bottom-side conductive traces. Top contacts can be coupled to the top insulating layer, and bottom contacts can be coupled to the bottom insulating layer.

The inductor can be integrated into various devices, including a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

A transformer for use in integrated circuit devices is disclosed herein. The transformer includes a high-resistivity substrate having a top-side, a bottom-side, a first sidewall and a second sidewall. The transformer also includes a plurality of substantially parallel top-side conductive traces on the top-side of the substrate, a plurality of substantially parallel bottom-side conductive traces on the bottom-side of the substrate, and a plurality of sidewall conductive traces on the first and second sidewalls of the substrate. Each of the sidewall conductive traces on the first and second sidewalls couple one of the top-side conductive traces to one of the bottom-side conductive traces. The transformer includes a first inductor and a second inductor. The first inductor has an input port, an output port, and a first continuous conductive path from the input port to the output port formed by a first set of the top-side conductive traces, a first set of the bottom-side conductive traces and a first set of the sidewall conductive traces. The second inductor has an input port, an output port, and a second continuous conductive path from the input port to the output port formed by a second set of the top-side conductive traces, a second set of the bottom-side conductive traces and a second set of the sidewall conductive traces. The second continuous conductive path is independent of the first continuous conductive path, and the first inductor is electromagnetically coupled to the second inductor.

The first continuous conductive path of the first inductor and the second continuous conductive path of the second inductor can be solenoid-shaped. The first continuous conductive path of the first inductor can be interleaved with the second continuous conductive path of the second inductor. When the first and second continuous conductive paths are interleaved, each top-side conductive trace of the first set of top-side conductive traces is adjacent to one of the top-side conductive traces of the second set of top-side conductive traces, each bottom-side conductive trace of the first set of bottom-side conductive traces is adjacent to one of the bottom-side conductive traces of the second set of bottom-side conductive traces, and each sidewall conductive trace of the first set of sidewall conductive traces is adjacent to one of the sidewall conductive traces of the second set of sidewall conductive traces.

The high-resistivity substrate can be made of glass, sapphire or quartz. The top-side conductive traces can be formed during back-end-of-line processing of an integrated circuit die. The bottom-side conductive traces can be formed by a backside plating process of the integrated circuit die. The transformer can also include channels on the first and second sidewalls of the substrate, and the sidewall conductive traces can be formed in the channels. The sidewall conductive traces can be printed on the first and second sidewalls of the substrate.

The transformer can include a plurality of top contacts and bottom contacts coupled to the first sidewall and the second sidewall of the substrate, where each of the sidewall conductive traces couples to one of the top-side conductive traces through one of the top contacts and couples to one of the bottom-side conductive traces through one of the bottom contacts. The transformer can also include a top insulating layer between the top-side of the substrate and the top-side conductive traces, and a bottom insulating layer between the bottom-side of the substrate and the bottom-side conductive traces. The top contacts can be coupled to the top insulating layer and the bottom contacts can be coupled to the bottom insulating layer.

The transformer can be integrated into various devices, including a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

An inductor having a first port and a second port for use in an integrated circuit device is disclosed that includes a high-resistivity substrate having an exterior surface, and a means for conducting current around the exterior surface of the substrate from the first port to the second port of the inductor. The means for conducting current can be solenoid-shaped.

A transformer for use in an integrated circuit device is disclosed that includes a high-resistivity substrate having an exterior surface, a first means for conducting current around the exterior surface of the substrate, and a second means for conducting current around the exterior surface of the substrate, where the first means is electromagnetically coupled to the second means. The first means and the second means can be solenoid-shaped. The first means can be interleaved with the second means.

For a more complete understanding of the present disclosure, reference is now made to the following detailed description and the accompanying drawings.

DETAILED DESCRIPTION

Figure 1:
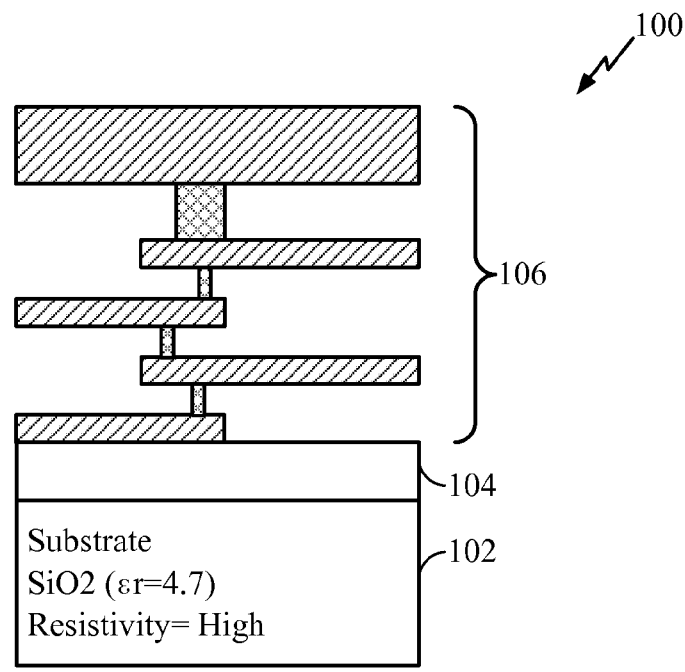
FIG. 1 is a schematic of a cross-section of a glass technology device.

FIG. 1 shows a glass technology die 100 which includes a glass substrate 102, a device layer 104, and multiple back-end of line (BEOL) layers 106. The glass substrate 102 has higher resistivity and a lower dielectric constant (about 4.7) than a complementary metal oxide semiconductor (CMOS) substrate. Other higher resistivity substrate materials can be used in integrated circuit dies, for example sapphire or quartz.

Figure 2:
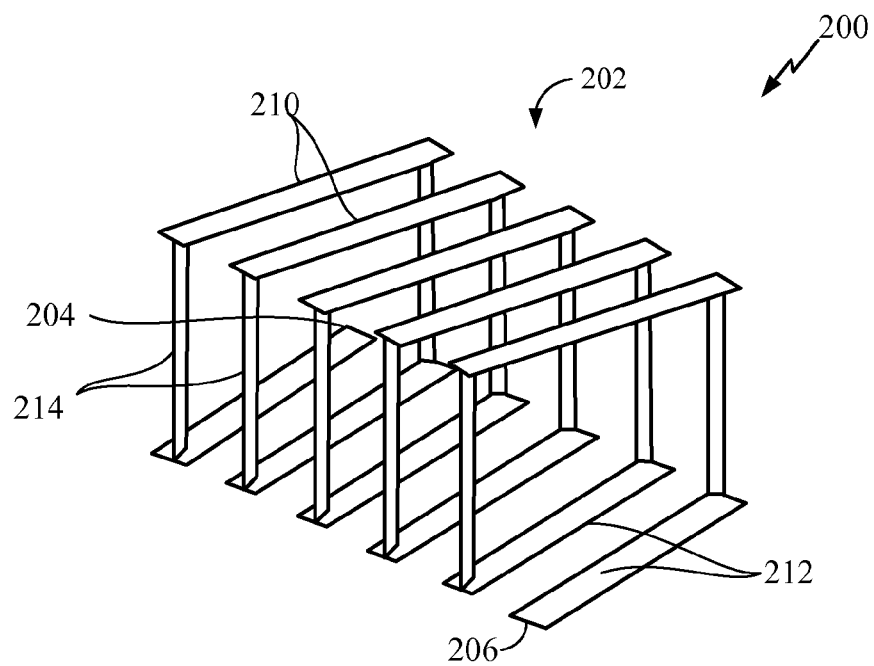
FIG. 2 is a schematic of a three-dimensional solenoid-shaped inductor.

FIG. 2 illustrates a three-dimensional inductor 200 comprising a solenoid-shaped conductive path 202, an input port 204 and an output port 206. The solenoid-shaped conductive path 202 comprises a plurality of substantially parallel top-side traces 210, bottom-side traces 212 and sidewall traces 214; the sidewall traces 214 coupling top-side traces 210 to bottom-side traces 212 to form progressive loops in the solenoid-shaped conductive path 202. The conductive path 202 extends from the input port 204 to the output port 206. Passing a current through the inductor 200 creates a magnetic field inside the solenoid-shaped conductive path 202. The inductance of the inductor 200 is proportional to the length of the conductive path 202, and the number of loops and the size of the loops in the conductive path 202.

Figure 3:
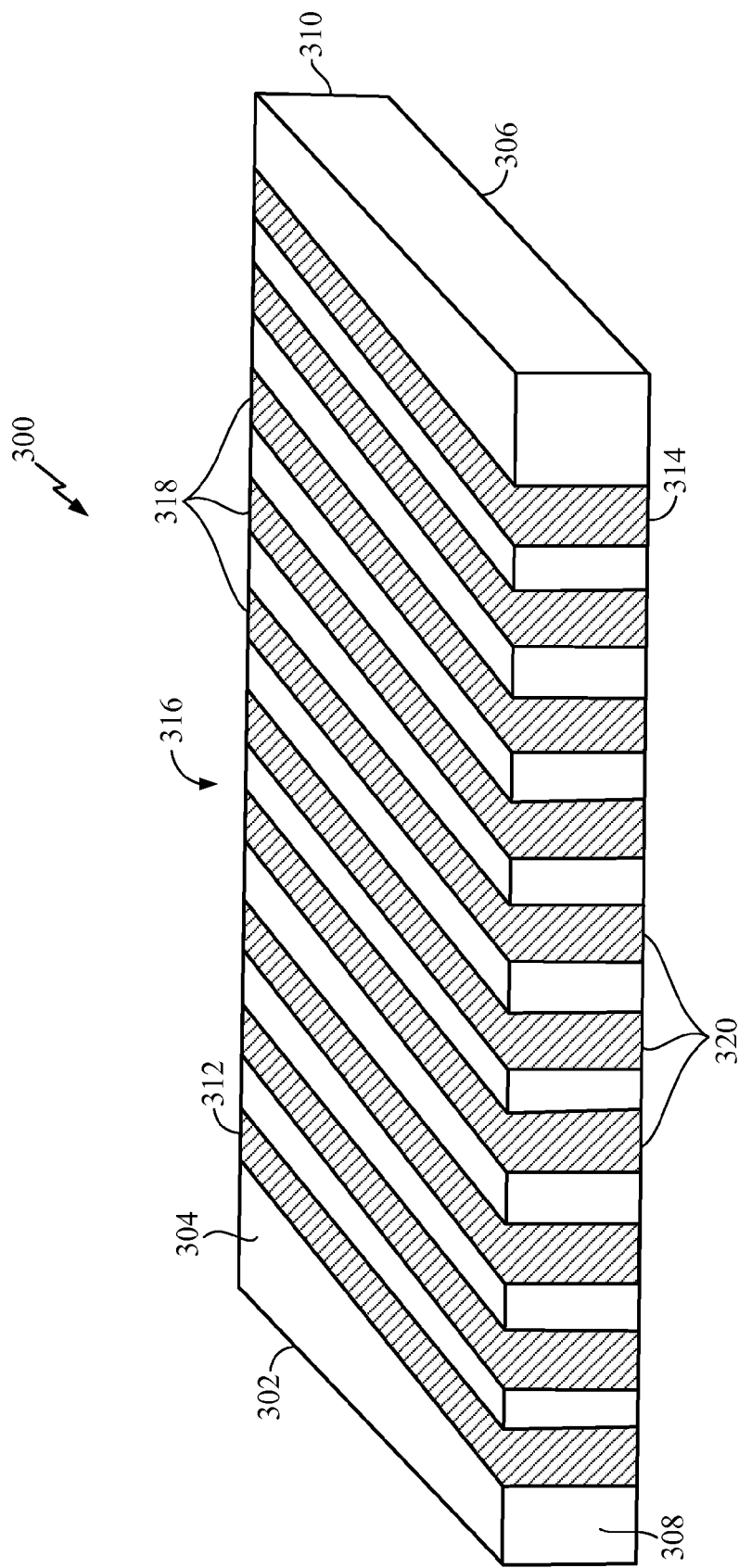
FIG. 3 is a schematic perspective view of a three-dimensional solenoid-shaped inductor implemented on a substrate.

FIG. 3 illustrates an embodiment of a three-dimensional, solenoid-shaped inductor 300 on a high resistivity substrate 302. The substrate 302 can be made of glass, sapphire or other suitable high resistivity material. The exemplary substrate 302 includes a top-side 304, a bottom-side 306, a first side-wall 308 and a second side-wall 310. The substrate could have other shapes with more or less sides if desired. The inductor 300 includes a first port 312, a second port 314 and a continuous solenoid-shaped conductive path 316 extending from the first port 312 to the second port 314. The solenoid shaped conductive path 316 comprises a plurality of substantially parallel top-side conductive traces 318 on the top-side 304 of the substrate 302, a plurality of substantially parallel bottom-side conductive traces (not shown) on the bottom-side 306 of the substrate 302, and a plurality of substantially parallel side-wall conductive traces 320 on the side-walls 308, 310 of the substrate 302. Each of the side-wall conductive traces 320 couples one of the top-side conductive traces 318 on the top-side 304 of the substrate 302 to one of the bottom-side conductive traces on the bottom-side 306 of the substrate 302 to form the continuous solenoid-shaped conductive path 316. Passing a current through the inductor 300 creates a magnetic field in the solenoid-shaped conductive path 316. The inductance of the inductor 300 is proportional to the length of the conductive path 316, the number of loops formed by the conductive traces and the size of the loops.

Figure 4:
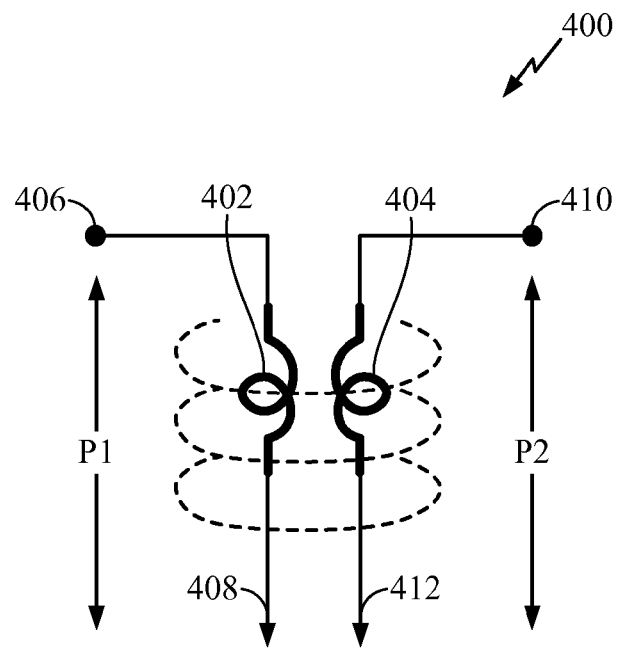
FIG. 4 is a representation of a transformer.

FIG. 4 illustrates a transformer 400 which includes a first inductor 402 and a second inductor 404. The first inductor 402 has a first port 406 and a second port 408; the first port 406 can be coupled to a primary circuit (not shown) and the second port 408 is shown coupled to ground. The second inductor 404 has a first port 410 and a second port 412; the first input 410 can be coupled to a load (not shown) and the second port 412 is shown coupled to ground. The first inductor 402 is physically separated from the second inductor 404 in a way that promotes electromagnetic coupling between the two inductors such that a varying current in the first inductor 402 produces a first potential P1 across the first inductor 402 of the transformer 400 which induces a second potential $P_2$ across the second inductor 404 of the transformer 400 to produce a voltage in the load.

Figure 5:
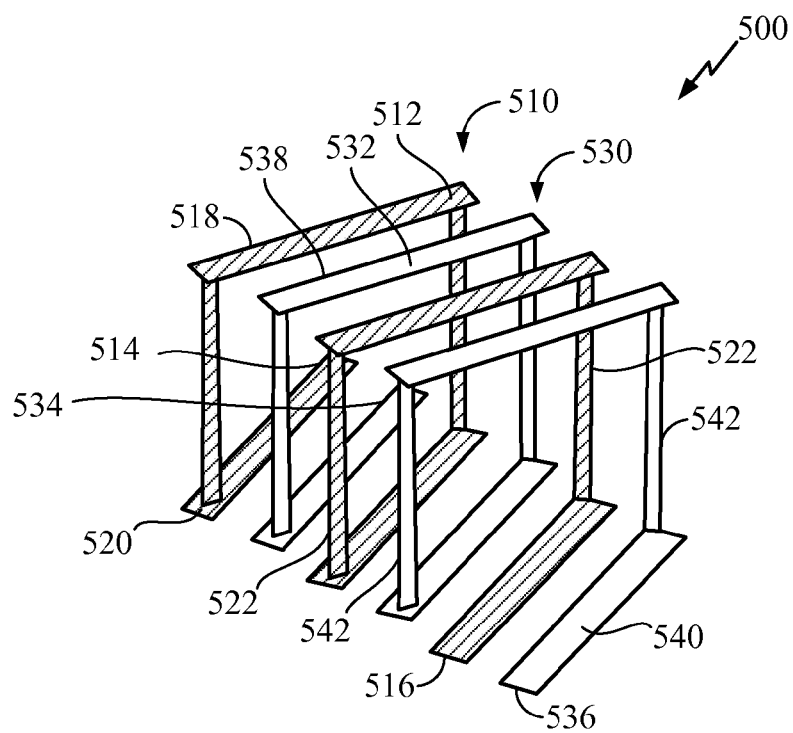
FIG. 5 is a schematic view of a three-dimensional transformer implemented by two three-dimensional solenoid-shaped inductors.

FIG. 5 illustrates a three-dimensional transformer 500 comprising a first solenoid-shaped inductor 510 interleaved with a second solenoid-shaped inductor 530. The first inductor 510 comprises a first solenoid-shaped conductive path 512 extending from a first input port 514 to a first output port 516. The first solenoid-shaped conductive path 512 comprises a plurality of substantially parallel top-side traces 518, bottom-side traces 520 and sidewall traces 522; the sidewall traces 522 coupling top-side traces 518 to bottom-side traces 520 to form progressive loops in the solenoid-shaped conductive path 512. The second inductor 530 comprises a second solenoid-shaped conductive path 532 extending from a second input port 534 to a second output port 536. The second solenoid-shaped conductive path 532 comprises a plurality of substantially parallel top-side traces 538, bottom-side traces 540 and sidewall traces 542; each of the sidewall traces 542 coupling one of the top-side traces 538 to one of the bottom-side traces 540 to form progressive loops in the second solenoid-shaped conductive path 532. Passing a current through the first inductor 510 of the transformer 500 creates a magnetic field which induces a current through the second inductor 530 of the transformer 500.

Figure 6:
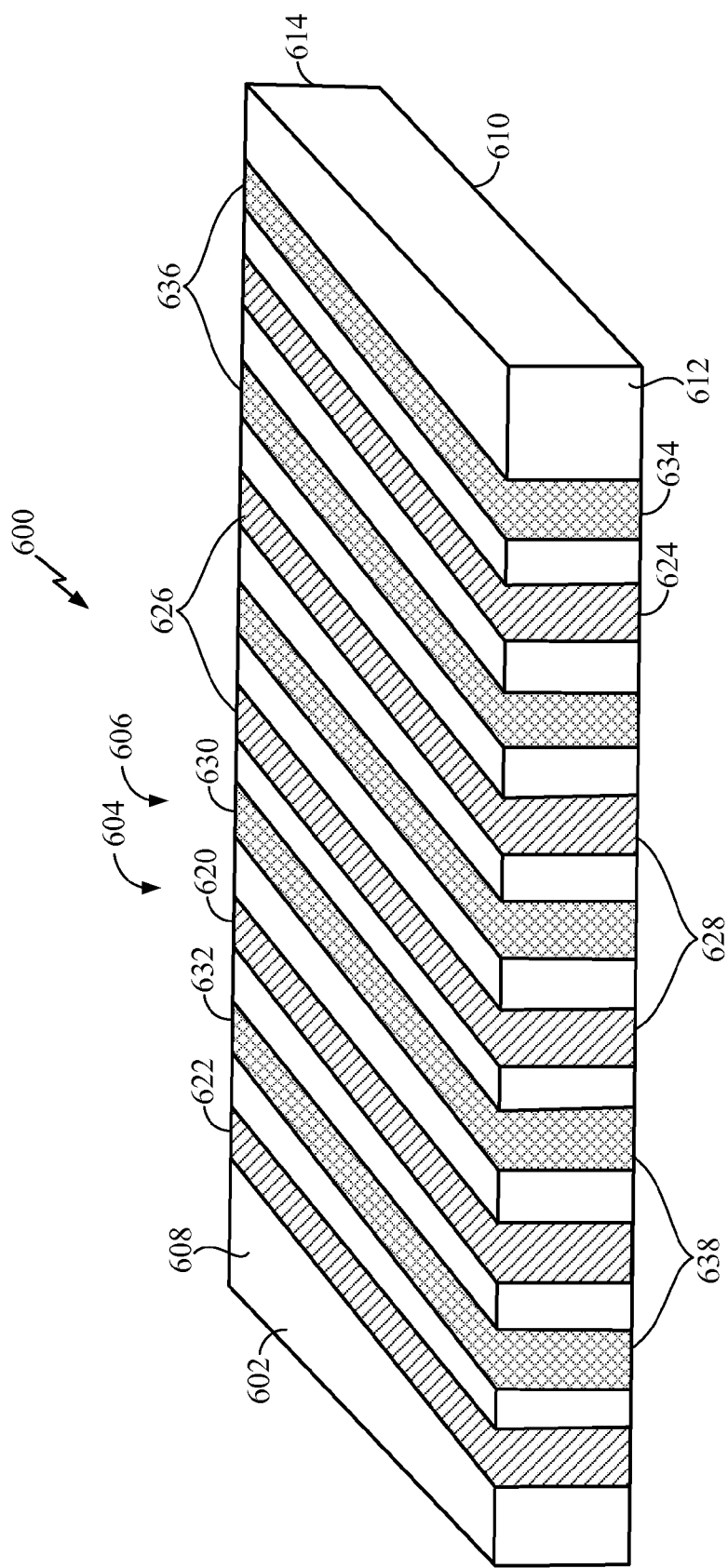
FIG. 6 is a schematic perspective view of a three-dimensional transformer implemented on a substrate by two three-dimensional solenoid-shaped inductors.

FIG. 6 illustrates an exemplary embodiment of a three-dimensional transformer 600 on a high resistivity substrate 602 that comprises a first solenoid-shaped inductor 604 interleaved with a second solenoid-shaped inductor 606 on the high resistivity substrate 602. The substrate 602 can be made of glass, sapphire or other suitable high resistivity material. The substrate 602 includes a top-side 608, a bottom-side 610, a first side-wall 612 and a second side-wall 614. The substrate could have other shapes with more or less sides if desired.

The first inductor 604 includes a first continuous solenoid-shaped conductive path 620 extending from a first input port 622 to a first output port 624. The first conductive path 620 comprises a plurality of substantially parallel top-side conductive traces 626 on the top-side 608 of the substrate 602, a plurality of substantially parallel bottom-side conductive traces (not shown) on the bottom-side 610 of the substrate 602, and a plurality of substantially parallel side-wall conductive traces 628 on the side-walls 612, 614 of the substrate 602. Each of the side-wall conductive traces 628 couples one of the top-side conductive traces 626 on the top-side 608 of the substrate 602 to one of the bottom-side conductive traces on the bottom-side 610 of the substrate 602 to form the continuous solenoid-shaped conductive path 620 of the first inductor 604.

The second inductor 606 includes a second continuous solenoid-shaped conductive path 630 extending from a second input port 632 to the second output port 634. The second conductive path 630 comprises a plurality of substantially parallel top-side conductive traces 636 on the top-side 608 of the substrate 602, a plurality of substantially parallel bottom-side conductive traces (not shown) on the bottom-side 610 of the substrate 602, and a plurality of substantially parallel side-wall conductive traces 638 on the side-walls 612, 614 of the substrate 602. Each of the side-wall conductive traces 638 couples one of the top-side conductive traces 636 on the top-side 608 of the substrate 602 to one of the bottom-side conductive traces on the bottom-side 610 of the substrate 602 to form the continuous solenoid-shaped conductive path 630 of the second inductor 606.

Passing a current through the first inductor 604 of the transformer 600 induces a current to flow through the interleaved second inductor 606 of the transformer 600.

Figure 7:
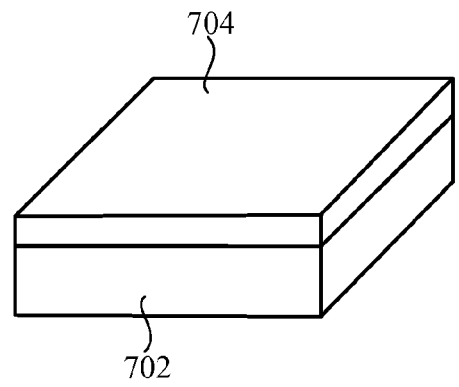
FIG. 7 is a simplified schematic view of a substrate with BEOL layers.
Figure 8:
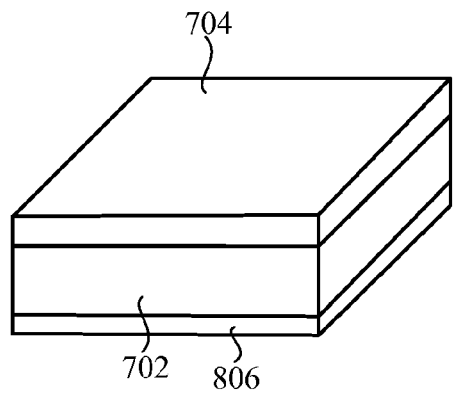
FIG. 8 is a simplified schematic view of the substrate of FIG. 8 with backside plating.
Figure 9:
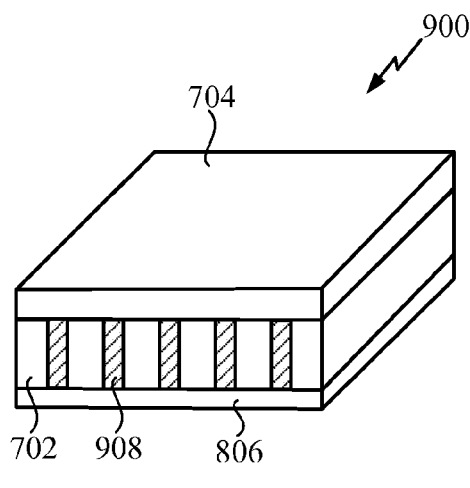
FIG. 9 is a simplified schematic view of the substrate of FIG. 9 with sidewall conductive traces.

FIGS. 7-9 illustrate an exemplary fabrication process for an inductor 900 similar to the inductor 300 shown in FIG. 3. A similar process can be used for fabrication of a transformer similar to the transformer 600 of FIG. 6. The exemplary process starts with a high-resistivity substrate 702. A set of parallel top-side conductive traces can be formed in the metal layers 704 on the high-resistivity substrate 702 during the back-end-of-lines (BEOL) fabrication process. A set of parallel bottom-side conductive traces 806 can be formed on the bottom side of the substrate 702 using a back-side plating process. A set of side-wall traces 908 can be formed on the side-walls of the substrate 702 such that each of the side-wall traces 908 couples one of the top-side traces in the metal layers 704 to one of the bottom-side traces in the back-side plating 806 to form a solenoid shaped conductive path around the exterior of the substrate 702.

Figure 10:
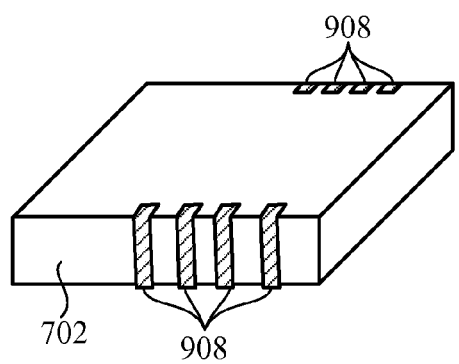
FIG. 10 is a simplified schematic view of the substrate of FIG. 10 with the BEOL layers and backside plating removed.

FIG. 10 shows a more detailed view of an exemplary embodiment of the side-wall traces 908 on the substrate 702 with the metal layers 704 and the back-side plating 806 removed for clarity. In this embodiment, the side-wall traces 908 are shown as indentations in the sidewalls of the substrate 702. These indentations can be formed by cutting the substrate to form notches or channels in the sidewalls. The sidewall traces 908 can then be formed in the notches or channels in the sidewalls of the substrate 702. In an alternative embodiment, the sidewall traces can be printed on the sidewalls of the substrate without forming notches or channels in the substrate.

Figure 11:
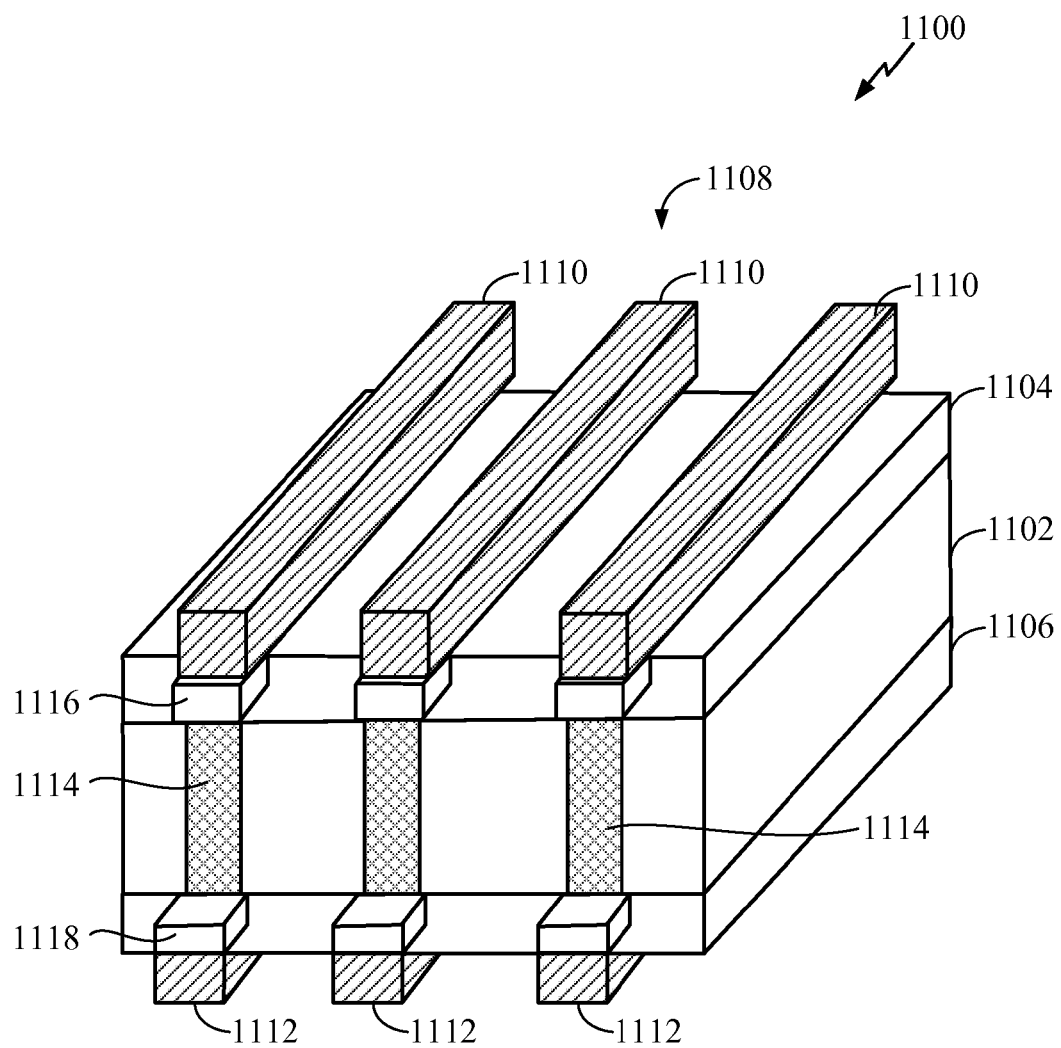
FIG. 11 is an embodiment of a transformer using sidewall contacts.

FIG. 11 illustrates a portion of an exemplary embodiment of an inductor 1100 formed on a substrate 1102. In this embodiment, a top insulating layer 1104 is formed on the top surface of the substrate 1102 and a bottom insulating layer 1106 is formed on the bottom surface of the substrate 1102. The inductor 1100 comprises a continuous conductive path 1108 that extends around the exterior of the substrate 1102, the top insulating layer 1104 and the bottom insulating layer 1106.

The conductive path 1108 of the inductor 1100 comprises a plurality of top-side conductive traces 1110 extending across the top of the top insulating layer 1104, a plurality of bottom-side conductive traces 1112 extending across the bottom of the bottom insulating layer 1106, and a plurality of sidewall traces 1114. Each of the sidewall traces 1114 couples one of the top-side conductive traces 1110 to one of the bottom-side conductive traces 1112. The top insulating layer 1104 is between the top surface of the substrate 1102 and the plurality of top-side traces 1110, and the bottom insulating layer 1106 is between the bottom surface of the substrate 1102 and the plurality of bottom-side traces 1112. The inductor 1100 also includes a plurality of top contacts 1116 coupled to the top insulating layer 1104, and a plurality of bottom contacts 1118 coupled to the bottom insulating layer 1106. The top contacts 1116 couple the top-side traces 1110 to the top of the sidewall traces 1114, and the bottom contacts 1118 couple the bottom-side traces 1112 to the bottom of the sidewall traces 1114. A similar structure of top metal contacts 1116, sidewall traces 1114 and bottom contacts 1118 is formed on the opposite sidewall of the substrate 1102 to couple the top metal traces 1110 and the bottom metal traces 1112 on the opposite sidewall of the substrate 1102. A continuous conductive path through the top metal traces 1110, the top contacts 1116, the sidewall traces 1114, the bottom contacts 1118 and the bottom metal traces 1112 forms a continuous conductive path of the inductor 1100.

Figure 12:
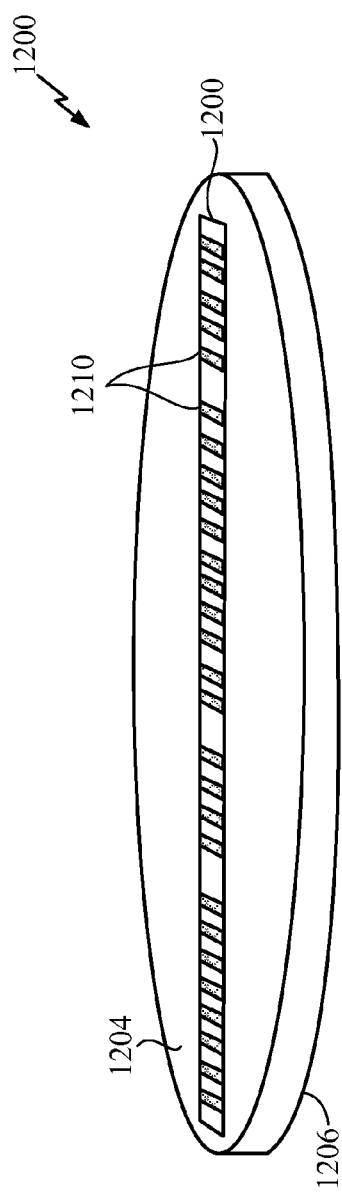
FIG. 12 illustrates a row of elements on a wafer.

FIGS. 12-16 illustrate an exemplary fabrication process for an inductor or transformer element. FIG. 12 illustrates an exemplary row of elements 1200 on a high-resistivity wafer 1202 having a top-side 1204 and a bottom-side 1206. Each of the elements in the row of elements 1200 includes multiple conductive traces 1210 on the top side 1204 of the wafer 1202. The conductive traces 1210 on the top side 1204 of the wafer 1202 can be formed of metal layers during the BEOL processing. Each of the elements in the row of elements 1200 also includes multiple conductive traces 1212 on the bottom-side 1206 of the wafer 1202. The conductive traces 1212 on the bottom-side 1206 of the wafer 1202 can be formed using a back-side plating process. The wafer 1202 can include multiple rows of elements but only one row 1200 is shown for clarity.

Figure 13:
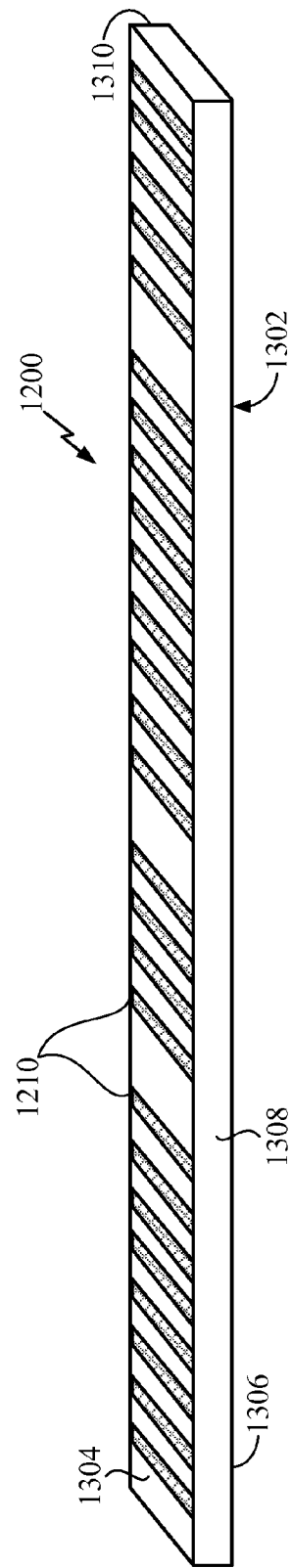
FIG. 13 illustrates the row of elements of FIG. 14 cut from the wafer.
Figure 14:
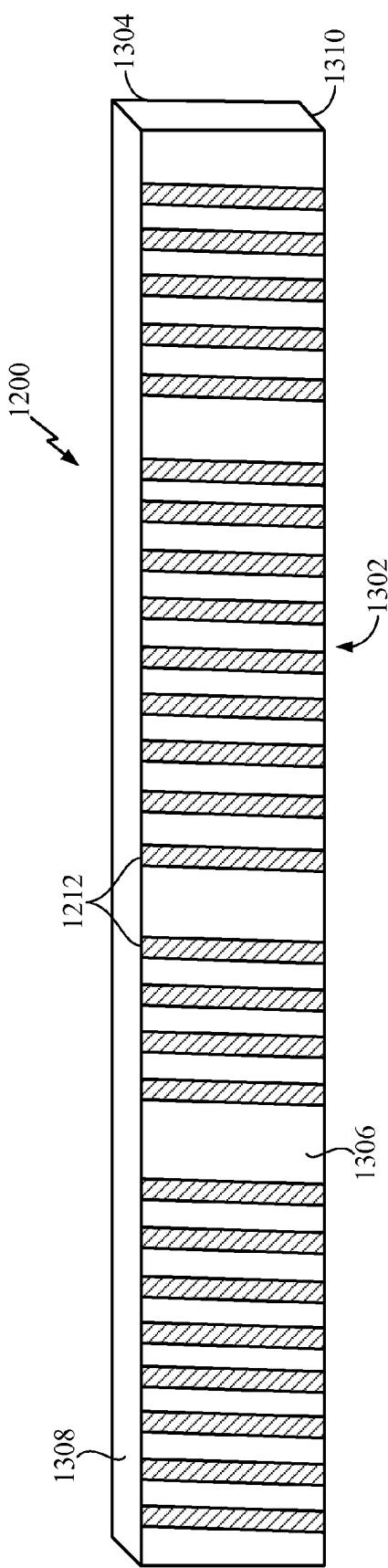
FIG. 14 illustrates the backside view of the row of elements of FIG. 15.

FIG. 13 illustrates the row of elements 1200 after it has been separated from the rest of the wafer 1202. The row of elements 1200 includes a substrate 1302 which was part of the wafer 1202. The substrate 1302 has a top-side 1304, a bottom-side 1306, a first side-wall 1308 and a second side-wall 1310. The conductive traces 1210 are on the top side 1304 of the substrate 1302. FIG. 14 shows an exemplary view of the bottom-side 1306 of the substrate 1302 showing the conductive traces 1212. Notches or channels can be made in the side-walls 1308, 1310 of the substrate 1302 during the process of cutting or separating the substrate 1302 from the wafer 1202. The notches or channels can be used for the side-wall traces to be formed later in the process.

Figure 15:
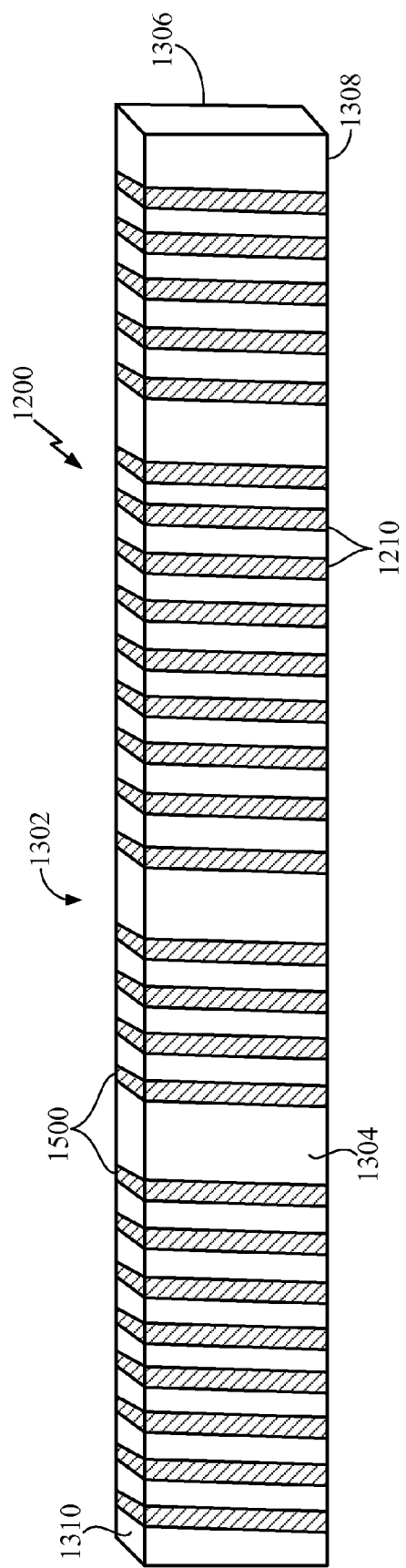
FIG. 15 illustrates the row of elements of FIG. 15 with sidewall conductive traces.

FIG. 15 illustrates the row of elements 1200 after the sidewall traces 1500 are formed on the first side-wall 1308 and the second side-wall 1310 of the substrate 1302. Each of the sidewall traces 1500 couples one of the top-side traces 1210 to one of the bottom-side traces 1212 to form a continuous conductive path. The side-wall traces 1500 can be formed in notches or channels formed in the first side-wall 1308 and the second side-wall 1310.

Figure 16:
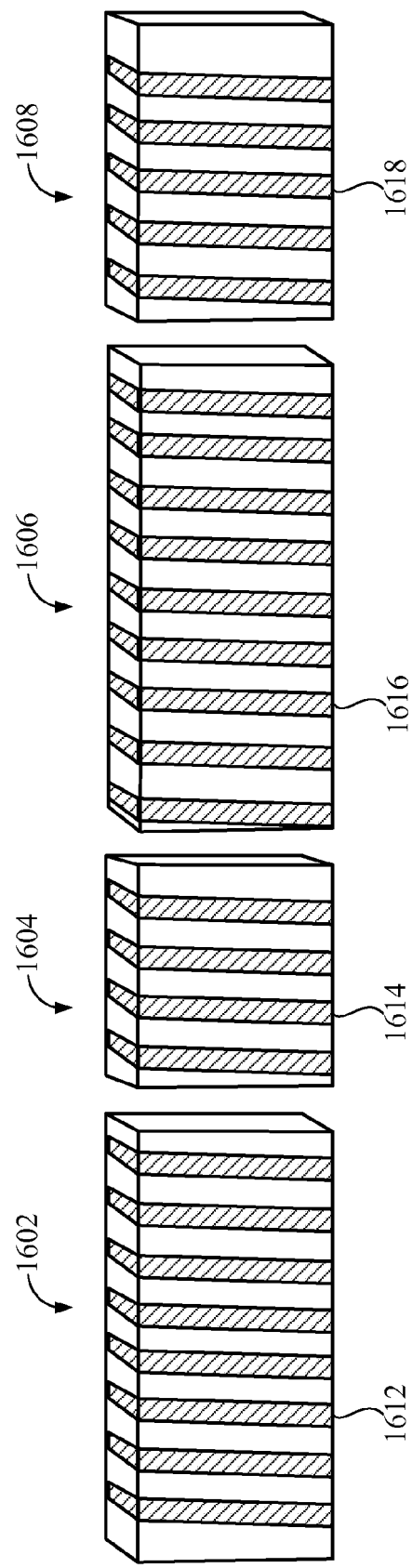
FIG. 16 illustrates the row of elements of FIG. 17 cut into separate elements.

FIG. 16 illustrates four transformer or inductor elements 1602, 1604, 1606, 1608 made by separating the row of elements 1200 into individual elements. Each of the elements 1602, 1604, 1606, 1608 comprises at least one continuous solenoid-shaped conductive path 1612, 1614, 1616, 1618, respectively, that extends around the top-surface, first sidewall, bottom surface and second sidewall of the substrate of the element 1602, 1604, 1606, 1608.

Figure 17:
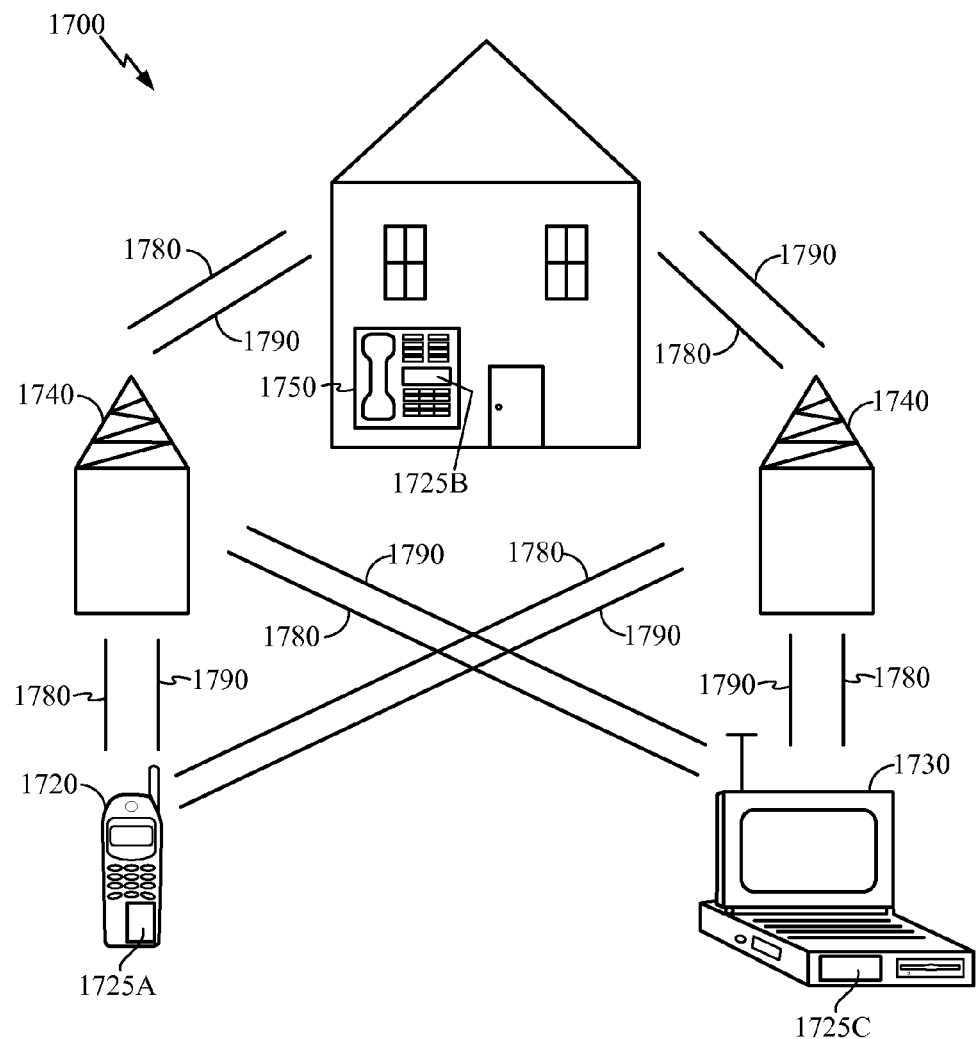
FIG. 17 is a block diagram showing an exemplary wireless communication system in which a three-dimensional inductor and/or transformer or other devices based thereon may be advantageously employed.

FIG. 17 shows an exemplary wireless communication system 1700 in which an embodiment of an inductor or transformer implemented by a plurality of conductive traces extending around the top, bottom and sidewalls of a substrate to form a continuous solenoid-shaped conductive path may be advantageously employed. For purposes of illustration, FIG. 17 shows three remote units 1720, 1730, and 1750 and two base stations 1740. It should be recognized that typical wireless communication systems may have many more remote units and base stations. Any of remote units 1720, 1730, and 1750 may include an inductor or transformer implemented by a plurality of conductive traces extending around the top, bottom and sidewalls of a substrate to form a continuous solenoid-shaped conductive path such as disclosed herein. FIG. 17 shows forward link signals 1780 from the base stations 1740 and the remote units 1720, 1730, and 1750 and reverse link signals 1790 from the remote units 1720, 1730, and 1750 to base stations 1740.

In FIG. 17, remote unit 1720 is shown as a mobile telephone, remote unit 1730 is shown as a portable computer, and remote unit 1750 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 17 illustrates certain exemplary remote units that may include inductors or transformers implemented as disclosed herein, the inductors and transformers implemented as disclosed herein are not limited to these exemplary illustrated units. Embodiments may be suitably employed in any electronic device in which inductors or transformers implemented by a plurality of conductive traces extending around the top, bottom and sidewalls of a substrate to form a continuous solenoid-shaped conductive path are desired.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An inductor having a first port and a second port for use in an integrated circuit device, the inductor comprising:
    a high-resistivity substrate having a top-side, a bottom-side, a first sidewall and a second sidewall;
    a plurality of substantially parallel top-side conductive traces on the top-side of the substrate;
    a plurality of substantially parallel bottom-side conductive traces on the bottom-side of the substrate;
    a plurality of sidewall conductive traces on the first sidewall of the substrate, each of the plurality of sidewall conductive traces on the first sidewall coupling one of the plurality of top-side conductive traces to one of the plurality of bottom-side conductive traces; and
    a plurality of sidewall conductive traces on the second sidewall of the substrate, each of the plurality of sidewall conductive traces on the second sidewall coupling one of the plurality of top-side conductive traces to one of the plurality of bottom-side conductive traces;
    the plurality of top-side conductive traces, bottom-side conductive traces and sidewall conductive traces forming a continuous conductive path from the first port to the second port of the inductor.

2. The inductor of claim 1, wherein the high-resistivity substrate is made of glass, sapphire or quartz.

3. The inductor of claim 1, wherein the top-side conductive traces are formed during back-end-of-line processing of an integrated circuit die.

4. The inductor of claim 3, wherein the bottom-side conductive traces are formed by a backside plating process of the integrated circuit die.

5. The inductor of claim 1, further comprising channels on the first sidewall and the second sidewall of the substrate, the sidewall conductive traces being formed in the channels.

6. The inductor of claim 1, wherein the sidewall conductive traces are printed on the first sidewall and the second sidewall of the substrate.

7. The inductor of claim 1, further comprising
    a plurality of top contacts coupled to the first sidewall and the second sidewall of the substrate, each of the plurality of sidewall conductive traces coupling to one of the plurality of top-side conductive traces through one of the plurality of top contacts; and
    a plurality of bottom contacts coupled to the first sidewall and the second sidewall of the substrate, each of the plurality of sidewall conductive traces coupling to one of the plurality of bottom-side conductive traces through one of the plurality of bottom contacts.

8. The inductor of claim 1, further comprising
    a top insulating layer on the top-side of the substrate, the top insulating layer being between the top-side of the substrate and the top-side conductive traces; and
    a bottom insulating layer on the bottom-side of the substrate, the bottom insulating layer being between the bottom-side of the substrate and the bottom-side conductive traces.

9. The inductor of claim 8, further comprising
    a plurality of top contacts coupled to the top insulating layer, each of the plurality of sidewall conductive traces coupling to one of the plurality of top-side conductive traces through one of the plurality of top contacts; and
    a plurality of bottom contacts coupled to the bottom insulating layer, each of the plurality of sidewall conductive traces coupling to one of the plurality of bottom-side conductive traces through one of the plurality of bottom contacts.

10. The inductor of claim 1, wherein the plurality of top-side conductive traces, bottom-side conductive traces and sidewall conductive traces form a solenoid-shaped conductive path from the first port to the second port of the inductor.

11. The inductor of claim 1, further comprising a device selected from the group consisting of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player, into which the inductor is integrated.

12. A transformer for use in integrated circuit devices, the transformer comprising:
    a high-resistivity substrate having a top-side, a bottom-side, a first sidewall and a second sidewall;
    a plurality of substantially parallel top-side conductive traces on the top-side of the substrate;
    a plurality of substantially parallel bottom-side conductive traces on the bottom-side of the substrate;
    a plurality of sidewall conductive traces on the first sidewall of the substrate, each of the plurality of sidewall conductive traces on the first sidewall coupling one of the plurality of top-side conductive traces to one of the plurality of bottom-side conductive traces;
    a plurality of sidewall conductive traces on the second sidewall of the substrate, each of the plurality of sidewall conductive traces on the second sidewall coupling one of the plurality of top-side conductive traces to one of the plurality of bottom-side conductive traces;
    a first inductor having an input port and an output port; the first inductor being formed by a first set of the plurality of top-side conductive traces, a first set of the plurality of bottom-side conductive traces and a first set of the plurality of sidewall conductive traces; the first sets of the plurality of top-side, bottom-side and sidewall conductive traces forming a first continuous conductive path from the input port to the output port of the first inductor; and
    a second inductor having an input port and an output port; the second inductor being formed by a second set of the plurality of top-side conductive traces, a second set of the plurality of bottom-side conductive traces and a second set of the plurality of sidewall conductive traces; the second sets of the plurality of top-side, bottom-side and sidewall conductive traces forming a second continuous conductive path from the input port to the output port of the second inductor; the second continuous conductive path being independent of the first continuous conductive path;
    wherein the first inductor is electromagnetically coupled to the second inductor.

13. The transformer of claim 12, wherein the first continuous conductive path of the first inductor is interleaved with the second continuous conductive path of the second inductor such that each top-side conductive trace of the first set of the plurality of topside conductive traces is adjacent to one of the top-side conductive traces of the second set of the plurality of top-side conductive traces, each bottom-side conductive trace of the first set of the plurality of bottom-side conductive traces is adjacent to one of the bottom-side conductive traces of the second set of the plurality of bottom-side conductive traces, and each sidewall conductive trace of the first set of the plurality of sidewall conductive traces is adjacent to one of the sidewall conductive traces of the second set of the plurality of sidewall conductive traces.

14. The transformer of claim 12, wherein the high-resistivity substrate is made of glass, sapphire or quartz.

15. The transformer of claim 12, wherein the top-side conductive traces are formed during back-end-of-line processing of an integrated circuit die.

16. The transformer of claim 15, wherein the bottom-side conductive traces are formed by a backside plating process of the integrated circuit die.

17. The transformer of claim 12, further comprising channels on the first sidewall and the second sidewall of the substrate, the sidewall conductive traces being formed in the channels.

18. The transformer of claim 12, wherein the sidewall conductive traces are printed on the first sidewall and the second sidewall of the substrate.

19. The transformer of claim 12, further comprising
a plurality of top contacts coupled to the first sidewall and the second sidewall of the substrate, each of the plurality of sidewall conductive traces coupling to one of the plurality of top-side conductive traces through one of the plurality of top contacts; and
a plurality of bottom contacts coupled to the first sidewall and the second sidewall of the substrate, each of the plurality of sidewall conductive traces coupling to one of the plurality of bottom-side conductive traces through one of the plurality of bottom contacts.

20. The transformer of claim 12, further comprising
a top insulating layer on the top-side of the substrate, the top insulating layer being between the top-side of the substrate and the top-side conductive traces; and
a bottom insulating layer on the bottom-side of the substrate, the bottom insulating layer being between the bottom-side of the substrate and the bottom-side conductive traces.

21. The transformer of claim 20, further comprising
a plurality of top contacts coupled to the top insulating layer, each of the plurality of sidewall conductive traces coupling to one of the plurality of top-side conductive traces through one of the plurality of top contacts; and
a plurality of bottom contacts coupled to the bottom insulating layer, each of the plurality of sidewall conductive traces coupling to one of the plurality of bottom-side conductive traces through one of the plurality of bottom contacts.

22. The transformer of claim 12, wherein the first continuous conductive path of the first inductor is solenoid-shaped, and the second continuous conductive path of the second inductor is solenoid-shaped.

23. The transformer of claim 12, further comprising a device selected from the group consisting of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player, into which the transformer is integrated.

* * * * *